(12) United States Patent
Tu et al.

(10) Patent No.: US 7,875,950 B2
(45) Date of Patent: Jan. 25, 2011

(54) SCHOTTKY DIODE STRUCTURE WITH MULTI-PORTIONED GUARD RING AND METHOD OF MANUFACTURE

(75) Inventors: Shanghui L. Tu, Phoenix, AZ (US); Fumika Kuramae, Fuchu (JP)

(73) Assignee: Semiconductor Components Industries, LLC, Phoenix, AZ (US)

( * ) Notice: Subject to any disclaimer, the term of this patent is extended or adjusted under 35 U.S.C. 154(b) by 314 days.

(21) Appl. No.: 11/683,502

(22) Filed: Mar. 8, 2007

(65) Prior Publication Data
US 2008/0217725 A1    Sep. 11, 2008

(51) Int. Cl.
*H01L 29/47* (2006.01)

(52) U.S. Cl. ........................ 257/476; 257/471; 257/475; 257/E27.068; 257/E27.016

(58) Field of Classification Search ............. 257/49, 257/73, 155, 280, 449, 471, 341, 472, 495, 257/484, 475, 476, 590, 478, E29.013, E27.051; 438/449, 471, 384
See application file for complete search history.

(56) References Cited

U.S. PATENT DOCUMENTS

| | | | | |
|---|---|---|---|---|
| 4,638,551 A * | 1/1987 | Einthoven | .................... | 438/530 |
| 4,774,560 A * | 9/1988 | Coe | ........................... | 257/495 |
| 4,979,001 A * | 12/1990 | Alter | ........................... | 257/337 |
| 5,418,185 A * | 5/1995 | Todd et al. | .................. | 438/384 |
| 5,907,179 A * | 5/1999 | Losehand et al. | ........... | 257/475 |
| 6,784,514 B2 * | 8/2004 | Sawdai et al. | ............... | 257/472 |
| 6,894,318 B2 * | 5/2005 | Chuang et al. | .............. | 257/109 |
| 7,019,377 B2 * | 3/2006 | Tsuchiko | ..................... | 257/476 |
| 2003/0057482 A1 * | 3/2003 | Harada | ....................... | 257/329 |
| 2004/0113204 A1 * | 6/2004 | Tsuchiko | ..................... | 257/341 |
| 2005/0040489 A1 * | 2/2005 | Chuang et al. | .............. | 257/471 |

FOREIGN PATENT DOCUMENTS

JP        08-107222       *  4/1996

OTHER PUBLICATIONS

Zettler et al. p-n Junction-Schottky Barrier Hybrid Diode. IEEE Transactions on Electrode Devices, vol. ED-16, No. 1, 1969, pp. 58-63.*

* cited by examiner

*Primary Examiner*—Lynne A Gurley
*Assistant Examiner*—Galina Yushina
(74) *Attorney, Agent, or Firm*—Kevin B. Jackson

(57) ABSTRACT

In one embodiment, a semiconductor structure comprises a multi-portioned guard ring that includes a first portion and a second portion formed in a region of semiconductor material. A conductive contact layer forms a first Schottky barrier with the region of semiconductor material. The conductive contact layer overlaps the second portion and forms a second Schottky barrier that has an opposite polarity to the first Schottky barrier. The conductive contact layer does not overlap the first portion, which forms a pn junction with the region of semiconductor material.

12 Claims, 4 Drawing Sheets

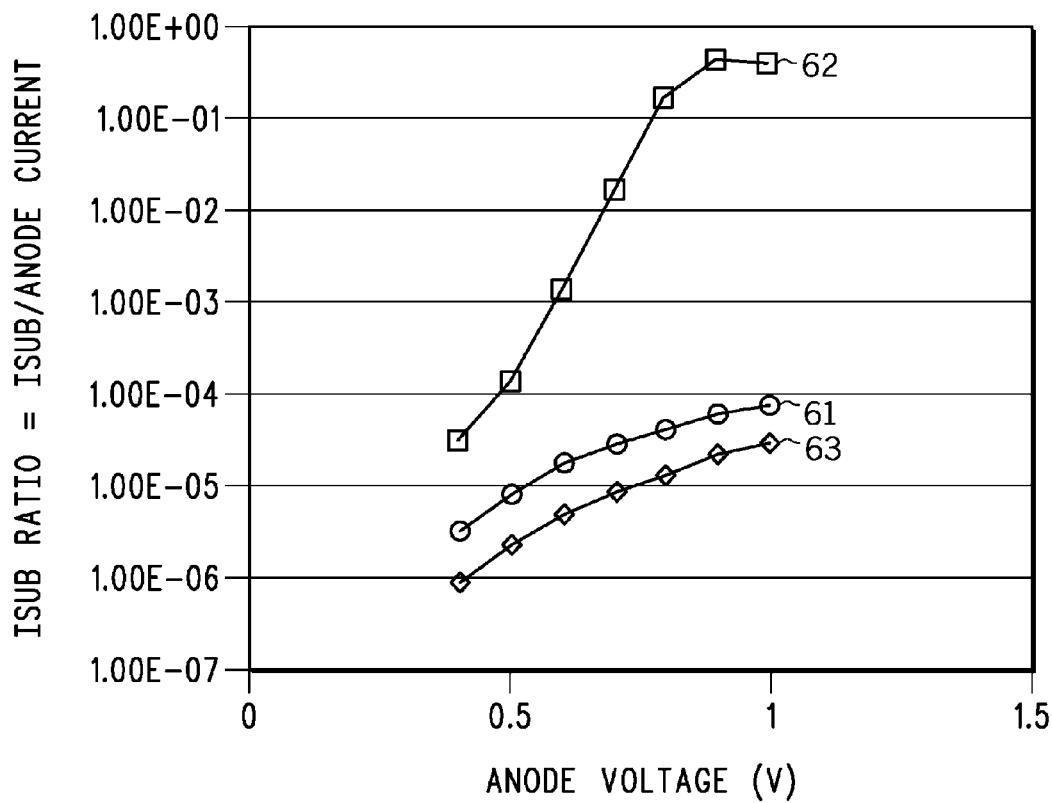
FIG. 3
FIG. 4
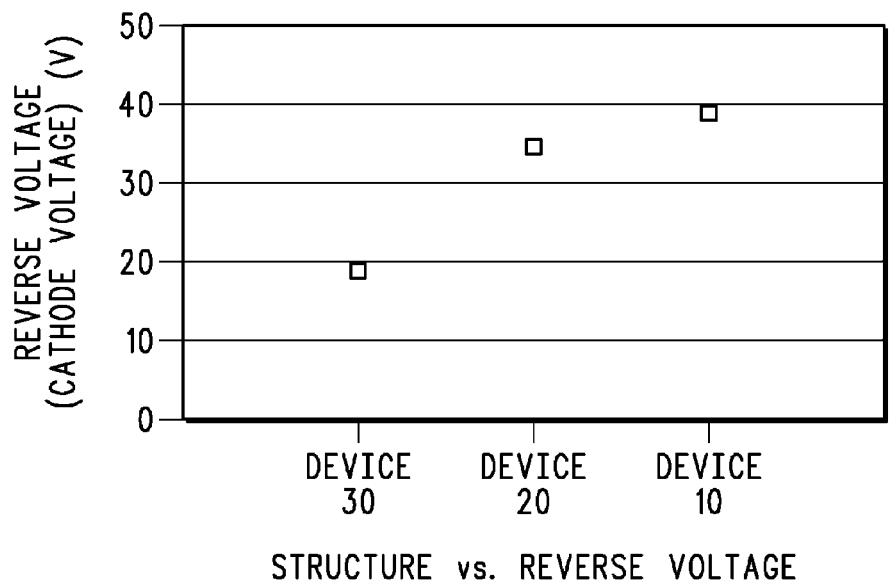
STRUCTURE vs. REVERSE VOLTAGE

SCHOTTKY DIODE STRUCTURE WITH MULTI-PORTIONED GUARD RING AND METHOD OF MANUFACTURE

FIELD OF THE INVENTION

This invention relates generally to electronic devices, and more specifically to semiconductor devices having enhanced performance and methods of manufacturing.

BACKGROUND OF THE INVENTION

Metal-semiconductor barrier devices such Schottky diode devices are widely used. For example, Schottky diodes are often integrated into digital logic circuits as fast switches. Also, discrete Schottky diodes are used as power rectifiers because, among other things, they sustain high currents at lower voltage drops compared to diffused pn-junction diodes. Additionally, Schottky diodes are used as variable capacitors that can be operated efficiently, for example, at microwave frequencies.

Schottky diodes are formed by placing a Schottky metal in direct contact with a semiconductor surface. Typical Schottky metals include chromium, platinum, and aluminum. One problem with Schottky diodes is that they exhibit, in general, higher leakage currents and lower breakdown voltages than theoretically predicted. This results in part from the presence of sharp contact edges, which results in severe electric field crowding when the device is under reverse bias conditions.

Manufacturers typically use a doped pn junction guard ring that substantially overlaps or covers the contact edges to lessen the electric field crowding effect. The guard ring is normally formed by the vertical diffusion of dopant of an opposite conductivity type to that of the semiconductor substrate, and the Schottky contact is then formed to contact those portions of the guard that are the most heavily doped. This approach is effective in reducing leakage current and increasing breakdown voltage. However, this approach results in a very high minority carrier injection during turn-on conditions because the guard ring is a parallel connected pn junction diode. This minority carrier injection significantly slows switching speeds and, in some integrated circuit applications, results in latch-up problems.

Accordingly, a need exists for a Schottky diode structure and method of manufacture that improves reverse breakdown voltage performance, overcomes the minority injection problem outlined above, is simple to integrate into existing integrated circuit process flows, and is cost effective.

BRIEF DESCRIPTION OF THE DRAWINGS

FIG. 3 is a graph of the ratio of substrate current to anode current ($I_S/I_A$) as a function of anode voltage comparing the Schottky structure of FIG. 1 to various prior art structures;

FIG. 4 is a graph comparing reverse voltage characteristics of the Schottky structure of FIG. 1 to various prior art structures;

Figure 1:
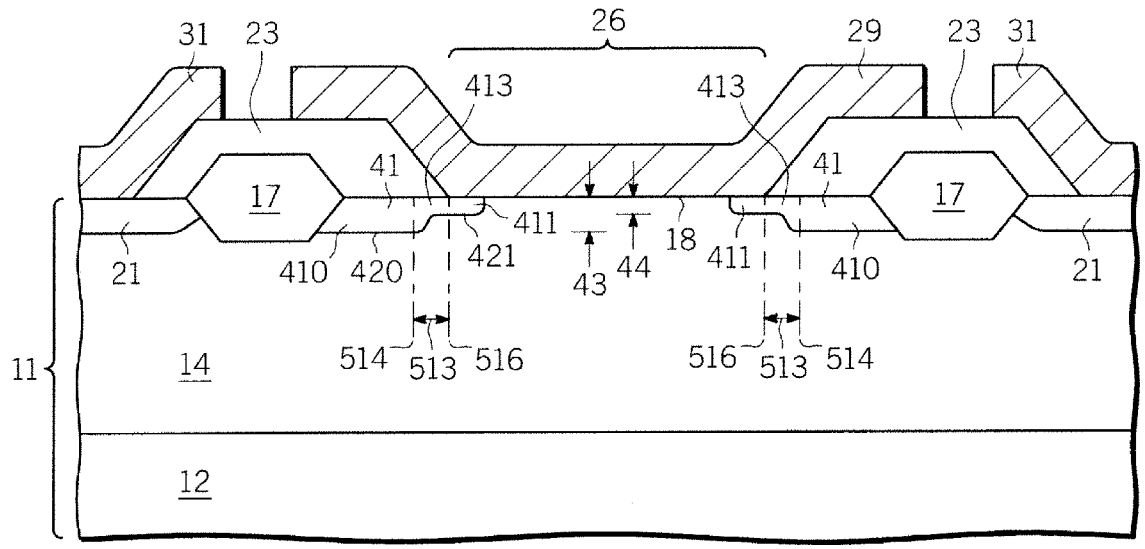
FIG. 1 illustrates a cross-sectional view of an embodiment of a Schottky structure in an integrated circuit configuration.

For ease of understanding, elements in the drawing figures are not necessarily drawn to scale, and like element numbers are used where appropriate throughout the various figures to denote the same or similar elements. For clarity in the drawings, doped regions of device structures or regions may be illustrated as having generally straight line edges and precise angular corners. However, those skilled in the art understand that due to the diffusion and activation of dopants, the edges of doped regions generally are not straight lines and the corners are not precise angles, and typically are rounded. Although certain conductivity types (e.g., p-type and n-type) are disclosed below, it is understood that the present invention includes and is relevant to those devices where the conductivity types are reversed from those that are specifically described herein.

DETAILED DESCRIPTION

In the general, the following description relates to a Schottky diode structure that has reduced off-state leakage and reduced on-state minority carrier injection. The structure achieves these improvements while maintaining desired breakdown voltage characteristics. More particularly, the following description relates to a Schottky diode structure that has a multi-portioned guard ring or doped region that extends from a major surface of a region of semiconductor material. The multi-portioned guard ring is contiguous and includes a first portion having a dopant concentration in proximity to the major surface that is configured to form an ohmic contact, and a second portion or portions having a dopant concentration in proximity to another portion of the major surface that is configured to form a Schottky contact. The Schottky diode further includes a conductive contact that forms a first Schottky barrier with the semiconductor substrate. The conductive contact overlaps the second portion of the guard ring and forms a second Schottky barrier with the second portion of the guard ring that has an opposite polarity to the first Schottky barrier. The conductive contact does not overlap or directly contact the first portion of the guard ring. With the conductive contact overlapping the second portion or more lightly doped portion of the guard ring, the contact edge is protected to provide reduced leakage and enhanced or sustained breakdown voltage characteristics. However, because the conductive contact does not overlap or directly contact the first portion or the more heavily doped portion of the guard ring, minority carrier injection is suppressed.

FIG. 1 shows an enlarged cross-sectional view of a Schottky device structure 10 in an integrated circuit configuration. Device 10 includes a region of semiconductor material 11, which comprises, for example, a p-type substrate 12 and an n-type well region, diffused region, or epitaxial region 14 formed in spaced relationship (in, within, on, or overlying) to substrate 12. Passivation regions 17 are formed using conventional techniques in proximity to a major surface 18 of region of semiconductor material 11 to define the various active areas of device 10. By way of example, passivation regions 17 comprise silicon oxide having a thickness of about one half (½) micrometers to about two (2) micrometers. It is understood that passivation regions 17 may comprise planar, semi-recessed, or trench passivation or isolation structures.

Device 10 further includes n-type doped regions or cathode regions 21 formed in a portion or portions of region 14. In this embodiment, regions 21 are formed in proximity to major surface 18, and are conveniently formed at the same time, for example, as source and drain regions in conventional CMOS processing. By way of example, regions 21 have a surface dopant concentration greater than about $5.0 \times 10^{18}$ atoms/cm$^3$.

Passivation regions 23 are formed overlying major surface 18 and are patterned to provide openings to regions 21 and an opening to a contact region or contact window 26. A conductive contact layer, Schottky or anode contact layer 29 is formed overlying and electrically coupled to region 14 through contact region 26. Conductive contact layer 29 forms a Schottky barrier with a portion of region 14 at major surface 18. A conductive contact layer or cathode layer 31 is formed in contact or electrically coupled with regions 21.

By way of example, region 14 has a surface doping concentration of about $1.0 \times 10^{16}$ atoms/cm$^3$ for a 20 volt device, or about $4.0 \times 10^{15}$ atoms/cm$^3$ for a 65 volt device. By way of further example, contact layers 29 and 31 comprise a conventional metal scheme used in CMOS processing. In one embodiment, contact layers 29 and 31 comprise titanium/titanium-nitride plus an aluminum-copper-silicon alloy layer to provide a Schottky barrier height of about 0.6 eV. In other embodiments, contact layer 29 comprises chromium, platinum, or palladium to target a specific Schottky barrier height in a range from about 0.5 eV to about 0.7 eV. It is not critical that layers 29 and 31 comprise the same material.

Device 10 further includes an offset, multi-portioned, laterally graded, dopant-wise laterally partitioned or dopant-wise sideways apportioned guard ring structure or doped region(s) 41 formed in region 14 at the periphery of contact window 26. In one embodiment, regions 41 are contiguous, and have at least two parts or portions that are distinguished or characterized by their dopant concentrations in proximity to major surface 18. By way of example, doped region 41 includes a first portion 410 that extends from major surface 18 to a vertical depth 43. Additionally, first portion 410 includes a vertical boundary 420 set apart or separated from major surface 18.

Doped region 41 further includes a second portion 411 that extends from major surface 18 to a vertical depth 44. Additionally, second portion 411 includes a vertical boundary 421 set apart or separated from major surface 18. In one embodiment, vertical depth 44 is less than vertical depth 43. In another embodiment, vertical depth 44 is greater than or equal to vertical depth 43. In accordance with the present embodiment of the invention, second portion 411 has a dopant concentration in proximity to major surface 18 that is less than the dopant concentration of first portion 410 in proximity to major surface 18. Stated another way, the dopant profile of second portion 411 is configured to form a Schottky barrier with conductive contact 29, which is opposite in polarity to the Schottky barrier formed between conductive contact 29 and region 14. In one embodiment, the dopant concentration of second portion 411 in proximity to major surface 18 is less than about $1.0 \times 10^{17}$ atoms/cm$^3$. In one embodiment, the dopant concentration of first portion 410 in proximity to major surface 18 is sufficient to form an ohmic contact if such a contact was made to first portion 410. By way of example, the dopant concentration for first portion 410 in proximity to major surface is between about $1.0 \times 10^{18}$ atoms/cm$^3$ and about $1.0 \times 10^{20}$ atoms/cm$^3$. Stated another way, first portion 410 is doped or configured to form a pn junction with region 14.

As shown in FIG. 1, in the present embodiment, passivation layer 23 overlies first portion 410 at major surface 18 so that conductive layer 29 does not make direct contact to first portion 410. In the present invention, conductive layer 29 makes direct contact to second portion 411 only without making direct contact to first portion 410. By direct contact, it is meant that conductive layer 29 makes contact to second portion 411 without an intervening dielectric layer or semiconductor layer. Although conductive layer 29 is shown as one layer of conductive material, it is understood that this layer may comprise multiple layers of conductive material.

In the embodiment shown, multi-portioned doped region 14 further includes a third, offset, or transitionary portion 413 between first and second portions 410 and 411. In the present invention, transitionary portion 413 corresponds to an offset distance 513, which is determined by an inner edge, first edge or reference point 514 of a masking window (described below) used to define first portion 410, and an edge 516 of contact window 26. In one embodiment, offset distance 513 is in a range from about 50% to about 80% of vertical depth 43. In a still further embodiment, offset distance 513 is about 75% of vertical depth 43.

Figure 2:
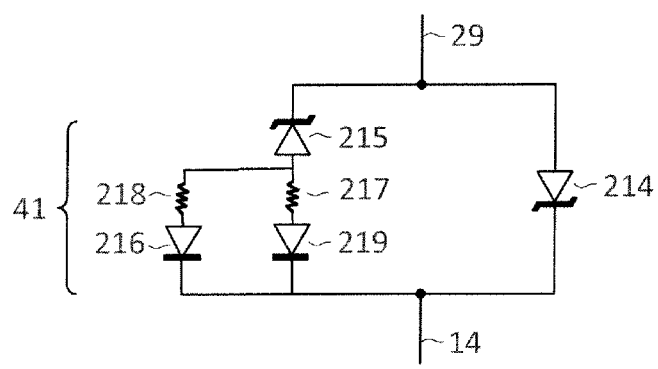
FIG. 2 is an equivalent circuit diagram of the Schottky structures of FIGS. 1 and 5.

FIG. 2 is a circuit diagram illustrating an equivalent circuit of device 10, where Schottky diode 214 corresponds to the Schottky barrier device formed between conductive contact 29 and region of semiconductor material 14, Schottky diode 215 corresponds to the Schottky barrier device formed between conductive contact 29 and second portion 411, diode 216 corresponds to the pn junction diode formed between first portion 410 and region of semiconductor material 14, and diode 219 corresponds to the pn junction diode formed between second portion 411 and region of semiconductor material 14. Resistances 217 and 218 correspond to the series resistances of portion 411 and portions 411, 413, and 410 respectively. It is evident from this diagram that when doped region 41 is p-type and region of semiconductor material 14 is n-type, device 215 is a p-type Schottky device, which is formed in the overlap region between conductive layer 29 and second portion 411 shown in FIG. 1. Device 215 is under reverse bias when device 214 is under forward bias. Because device 215 is under reverse bias, device 215 limits the current flow through the pn junctions formed between first portion 410 and region of semiconductor material 14 (diode 216) and second portion 411 and region of semiconductor material 14 (diode 219), and thus minimizes the hole or minority carrier injection from the p-type guard ring into region of semiconductor material 14.

In a conventional guard ring Schottky device that does not have the multi-portioned structure as described herein, the contact between the conventional guard ring and the metal contact is more ohmic in nature. As a result, a pn junction is formed between the guard ring and the well region at this location, and the pn junction diode is also under forward bias with the conventional Schottky barrier. As a consequence, a large minority carrier current is injected from the conventional guard ring into the well region. This results in undesirable substrate current, which is further illustrated in FIG. 3.

FIG. 3 shows a graph of the ratio of substrate current to anode current ($I_S/I_A$) as a function of anode voltage comparing device 10 (i.e., a device having a multi-portioned guard ring in accordance with the present invention) to a conventional Schottky device without a guard ring and a Schottky device with a conventional pn junction guard ring. Data set 61 corresponds to the $I_S/I_A$ ratio performance for device 10; data set 62 corresponds to $I_S/I_A$ ratio performance for a conventional device with a conventional pn junction guard ring; and data set 63 corresponds to a $I_S/I_A$ ratio performance for conventional device without a guard ring.

FIG. 4 shows a graph comparing the reverse voltage characteristics for device 10 (i.e., a device having a multi-portioned guard ring in accordance with the present invention) to a Schottky device 20 with a conventional pn junction guard ring, and a conventional Schottky device 30 without a guard ring. The data of FIG. 4 was taken at one (1) microampere of current. As is evident from the data of FIG. 3 and FIG. 4, device 10 has an excellent $I_S/I_A$ ratio (approaches the performance of the no guard ring structure) while sustaining a reverse voltage that exceeds both conventional Schottky structures.

Figure 5:
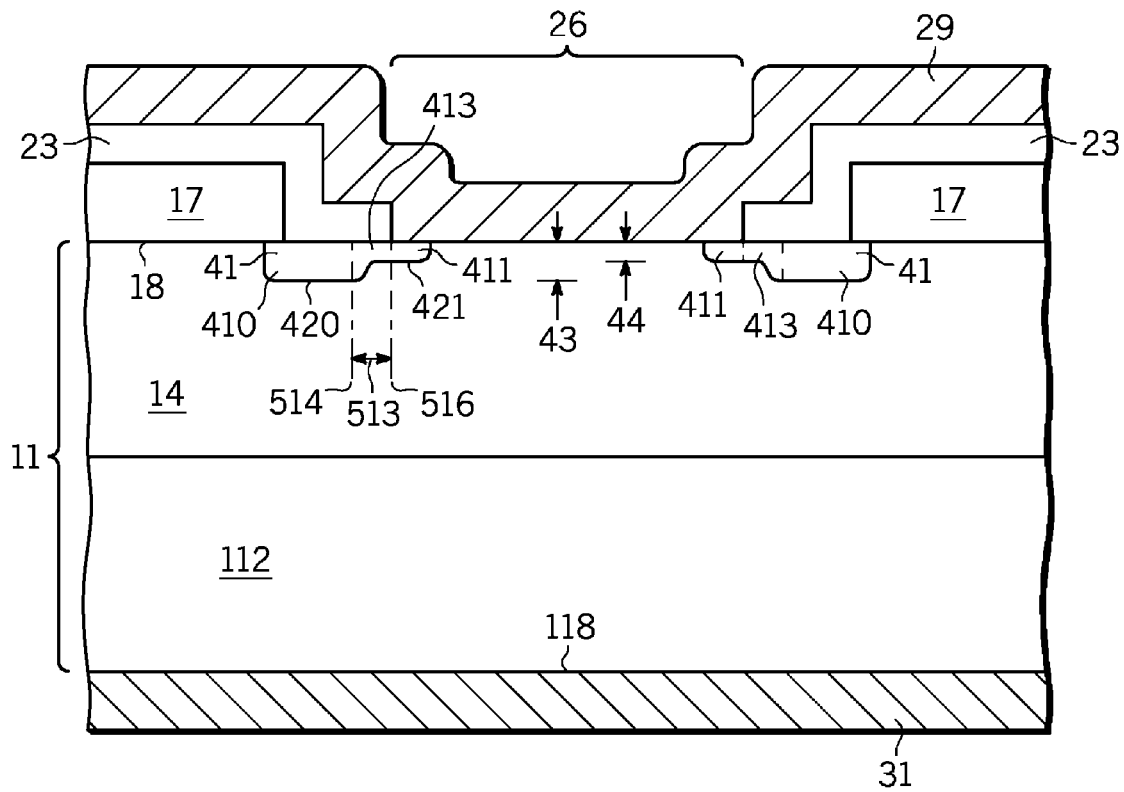
FIG. 5 illustrates a cross-sectional view of another embodiment of a Schottky structure.

FIG. 5 shows a cross-sectional view of a Schottky structure or device 50 having a multi-portioned guard ring 41 in accordance with another embodiment. Device 50 is a vertical Schottky device, and is similar to device 10 except that region of semiconductor material 11 includes a substrate 112 that is the same conductivity type as layer or region 14. Substrate 112 has a very high dopant concentration to minimize series resistance. In addition, in device 50, conductive layer or cathode contact 31 is on major surface 118, which is opposite to major surface 18.

Figure 6:
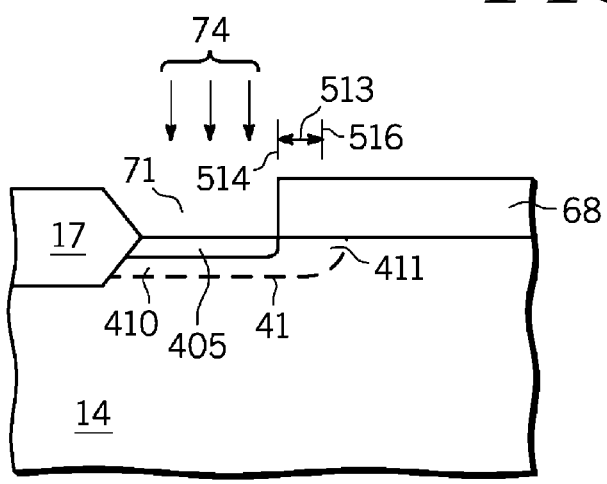
FIGS. 6-9 show various partial cross-sectional views of Schottky structures during processing to illustrate different methods of fabricating a multi-portioned doped region in accordance with the present invention.

FIGS. 6-9 show partial cross-sectional views of Schottky structures during processing to illustrate various methods of fabricating multi-portioned guard rings. In FIG. 6, a masking layer 68 is formed overlying major surface 18 and patterned to form a first opening or window 71. As described in FIG. 1, the innermost edge of opening 71 defines inner edge 514 and reference point or edge 516 corresponds to edge 516 of contact window 26, which is formed at a subsequent fabrication step. The lateral distance between edges 516 and 514 defines offset distance 513. By way of example, masking layer 68 comprises a photoresist layer or a dielectric layer formed using conventional techniques. In this example, an ion implant 74 is used to form multi-portioned guard ring 41. The implanted dopant is shown as region 405, which is subsequently heat treated to diffuse and activate the dopant vertically to form portion 410 and laterally to form portion 411 of multi-portioned guard ring 41. Multi-portioned guard ring 41 is shown in phantom simply to illustrate that it is formed at subsequent step.

Ion implant 74 comprises a dose to provide a dopant concentration for portion 411 in proximity to major surface 18 sufficient to form a Schottky barrier after the implanted dopant is laterally diffused (i.e., less than about $1.0 \times 10^{17}$ atoms/cm$^3$) from edge 514 of opening 71, and to provide a dopant concentration for portion 410 in proximity to major surface 18 sufficient to form an ohmic contact (i.e., between about $1.0 \times 10^{18}$ atoms/cm$^3$ and about $1.0 \times 10^{20}$ atoms/cm$^3$). In later steps, masking layer 68 is removed, and passivation layer 23 is formed and patterned to provide contact window 26 as shown in FIGS. 1 and 5. Conductive contact layer 29 is then formed contacting at least a portion of portion 411 while portion 410 is covered or isolated from conductive contact layer 29 by passivation layer 23 (shown in FIGS. 1 and 5).

Figure 7:
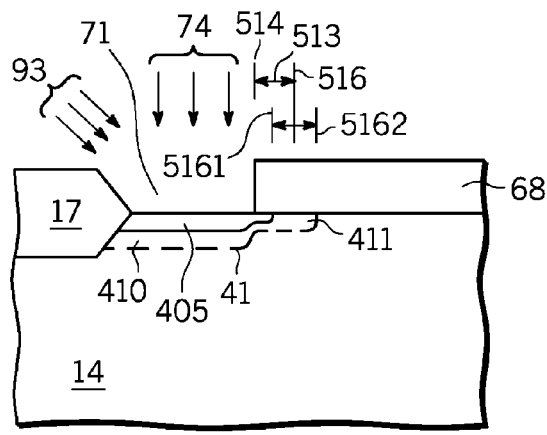

The embodiment of FIG. 7 is similar to the embodiment of FIG. 6 with the addition of an angled ion implant 93. Implant 93 is used to provide a more controlled dopant introduction for portion 411. In this embodiment, implant 74 is used to provide dopant for portion 410. The implants are performed in either order with implant 93 having a lighter implant dose than implant 74. The implanted dopant is shown as region 405, which is subsequently heat treated to diffuse and activate the dopant to form multi-portioned guard 41.

Implant 93 comprises a dose to provide a dopant concentration for portion 411 in proximity to major surface 18 sufficient to form a Schottky barrier after the implanted dopant is diffused (i.e., less than about $1.0 \times 10^{17}$ atoms/cm$^3$). Implant 74 comprises a does to provide a dopant concentration for portion 410 in proximity to major surface 18 sufficient to form an ohmic contact (i.e., between about $1.0 \times 10^{18}$ atoms/cm$^3$ and about $1.0 \times 10^{20}$ atoms/cm$^3$). In later steps, masking layer 68 is removed, and passivation layer 23 is formed and patterned to provide contact window 26 as shown in FIGS. 1 and 5. Conductive contact layer 29 is then formed contacting portion 411 while portion 410 is covered or isolated from conductive contact layer 29 by passivation layer 23. In this embodiment, edge 516 of contact window can be placed between reference points 5161 (i.e., approximate edge of angled implant 93) and 5162 (i.e., approximate edge of the out diffusion of angled implant 93 after heat treatment), which increases photolithographic alignment tolerances for offset distance 513.

Figure 8:
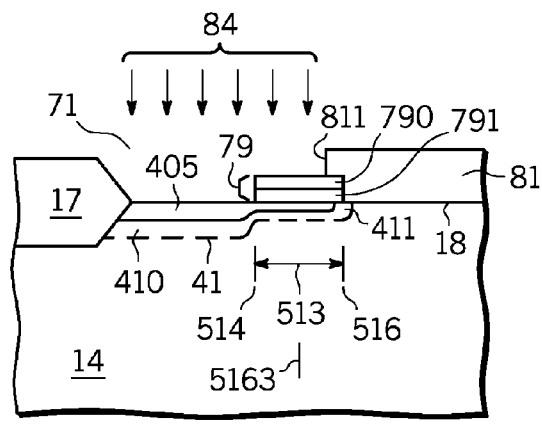

In FIG. 8, a self-aligned feature 79 is used to form portion 411. By way of example, feature 79 comprises one or more layers such as a polysilicon layer 790 overlying a dielectric layer 791, which are deposited overlying major surface 18 and then patterned to form feature 79. A masking layer 81 such as a photoresist layer is formed and patterned overlying major surface 18 so that a portion of masking layer 81 overlaps a portion of feature 79. An ion implant 84 is used to introduce dopant through window 71 and the exposed portion of feature 79 to form doped region 405, which is later heat treated to diffuse and activate the dopant to form multi-portioned guard ring 41. In this embodiment, feature 79 is configured to block a portion of ion implant 84 so that less dopant reaches major surface 18 underlying feature 79. This controls the dopant concentration for portion 411 in proximity to major surface 18. Edge 811 of masking layer 81 is placed at a location on feature 79 so that sufficient implanted dopant laterally diffuses out from underneath feature 79 when portion 411 is formed. This assures contact between portion 411 and conductive contact 29. Once masking layer 81 is removed, passivation layer 23 is formed and patterned to provide contact window 26. Conductive contact layer 29 is then formed and conveniently self aligned because of feature 79. In this embodiment, offset distance 513 is determined by the width (distance from 514 to 516) of feature 79 and is thus, not limited by photolithographic alignment tolerances. Reference point 5163 is an edge for contact window 26, and can be anywhere overlying feature 79.

Figure 9:
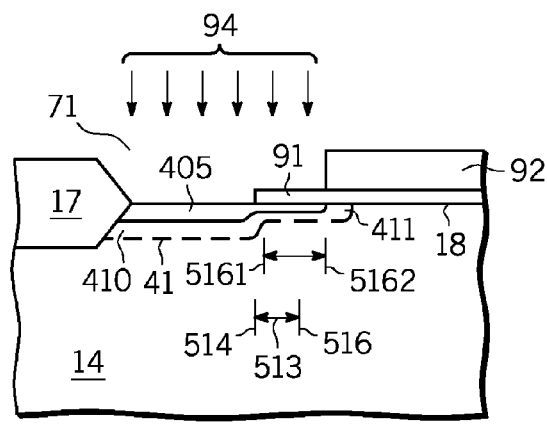

In the embodiment shown in FIG. 9, a screen oxide or dopant masking layer 91 is formed and patterned overlying a pre-determined portion of major surface 18. A masking layer (e.g., photoresist) 92 is then formed and patterned overlying a portion of screen oxide layer 91. An ion implant 94 is used to introduce dopant through window 71 and the exposed portion of screen oxide layer 91 to form doped region 405, which is later heat treated to diffuse and activate the dopant to form multi-portioned guard ring 41. In this embodiment, screen oxide 91 is configured to block a portion of ion implant 94 so that less dopant reaches major surface 18 underlying screen oxide 91. Masking layer 92 prevents any dopant from reaching major surface 18 where the primary Schottky barrier will be formed. Subsequently, layers 91 and 92 are removed, passivation layer 23 is formed and patterned to provide contact window 26 as shown in FIGS. 1 and 5. Conductive contact layer 29 is then formed contacting at least a portion of portion 411 while portion 410 is covered or isolated from conductive contact layer 29 by passivation layer 23. In this embodiment, offset distance 513 is not limited by photolithographic alignment tolerances, and as a result, edge 516 can be placed anywhere between reference points 5161 and 5162.

Thus, it is apparent that there has been provided, in accordance with the present invention, a structure and method for a Schottky barrier device having a multi-portioned guard ring. The multi-portioned guard ring protects the contact edge of the Schottky contact layer to provide low leakage and sustained reverse voltage characteristics under reverse bias conditions. Under forward bias conditions, the multi-portioned guard ring forms an opposite polarity Schottky structure with the Schottky contact layer. This opposite polarity Schottky structure is in series with a parasitic pn junction and functions to suppress minority carrier injections. This lowers substrate current.

Although the invention has been described and illustrated with reference to specific embodiments thereof, it is not intended that the invention be limited to these illustrative embodiments. For example, other doping techniques are used to form multi-portioned guard ring 41 including conventional chemical vapor deposition and diffusion techniques, spin-on doping techniques, or other doped film techniques. Additionally, a buried layer may be added to device 10 to lower series resistance.

What is claimed is:

1. A Schottky diode structure comprising:
   a region of semiconductor material having a first major surface and a first conductivity type;
   a doped region of a second conductivity type opposite the first conductivity type formed in the region of semiconductor material and extending from the first major surface, wherein the doped region comprises a first portion having a first dopant concentration in proximity to the first major surface and a second portion having a second dopant concentration in proximity to the first major surface, and wherein the second dopant concentration of the second portion is less than the first dopant concentration of the first portion, and wherein the first portion forms a first pn junction with a first part of the region of semiconductor material, and wherein the second portion forms a second pn junction with a second part of the region of semiconductor material;
   a first conductive contact electrically coupled to a third part of the region of semiconductor material; and
   a second conductive contact contacting the second portion at the first major surface but not the first portion, and wherein the second conductive contact forms a first Schottky barrier with a fourth part of the region of semiconductor material and a second Schottky barrier with the second portion, and wherein the first portion extends into the region of semiconductor material at a first vertical distance, and wherein the second conductive contact is offset from the first portion a lateral distance in a range from about 50% to about 80% of the first vertical distance.

2. The structure of claim 1, wherein the lateral distance is about 75% of the first vertical distance.

3. The structure of claim 1, wherein the first and second conductive contacts are on opposite surfaces of the region of semiconductor material.

4. The structure of claim 1, wherein the first and second conductive contacts are on the first major surface.

5. The structure of claim 1, wherein the first portion extends into the region of semiconductor material to define a first vertical boundary, and wherein the second portion extends into the region of semiconductor material to define a second vertical boundary.

6. The structure of claim 5, wherein the first vertical boundary extends into the region of semiconductor material to a greater extent than the second vertical boundary.

7. The structure of claim 1, wherein the region of semiconductor material comprises:
   a semiconductor substrate; and
   a semiconductor layer of the first conductivity type formed in spaced relationship with the semiconductor substrate.

8. The structure of claim 7, wherein the semiconductor substrate comprises the second conductivity type.

9. The structure of claim 1, wherein the first and second portions are contiguous.

10. A semiconductor device having a multi-portioned doped region comprising:
    a region of semiconductor material having a first major surface and a first conductivity type;
    a passivation layer formed overlying a first part of the region of semiconductor material, wherein the passivation layer includes a contact window with a first edge;
    the multi-portioned doped region formed in a second part the region of semiconductor material and extending from the first major surface, wherein the multi-portioned doped region comprises a second conductivity type opposite to the first conductivity type, and wherein the multi-portioned doped region includes a first portion having a first dopant concentration in proximity to one portion of the first major surface and extending into the region of semiconductor material to a first vertical depth, a second portion having a second dopant concentration in proximity to a different portion of the first major surface and extending into the region of semiconductor material to a second vertical depth less than the first vertical depth, and a third portion laterally between the first and second portions, and wherein the third portion underlies the passivation layer a lateral distance from the first edge in a range from about 50% to about 80% of the first vertical depth, and wherein the second dopant concentration of the second portion is less than the first dopant concentration of the first portion, and wherein the first portion forms a first pn junction with the region of semiconductor material and the second portion forms a second pn junction with the region of semiconductor material; and
    a conductive contact electrically coupled to a second part the region of semiconductor material, wherein the conductive contact further contacts at least a portion of the second portion at the major surface but not the first portion, and wherein the conductive contact forms a first Schottky barrier with the second part of the region of semiconductor material and a second Schottky barrier with the second portion.

11. The structure of claim 10, wherein the conductive contact is self-aligned to the second portion.

12. The structure of claim 10, wherein the first portion is contiguous with the third portion but not the second portion, and wherein the third portion is contiguous with the second portion.

* * * * *